March 15, 1966 D. L. HARTON 3,241,094

SOCKET FOR ELECTRICAL COMPONENT

Filed Jan. 8, 1962

INVENTOR.
DONALD L. HARTON
BY
Killman, Smith & Lamb
ATTORNEYS 3,241,094
Patented Mar. 15, 1966

3,241,094
SOCKET FOR ELECTRICAL COMPONENT

Donald L. Harton, Baltimore, Md., assignor to The Bendix Corporation, Towson, Md., a corporation of Delaware Filed Jan. 8, 1962, Ser. No. 164,732
1 Claim. (Cl. 339—61)

This invention relates to sockets for electrical devices and more particularly to a socket having special utility for use with transistors and similar small electrical devices.

In most electrical circuits using transistors, they are soldered directly into the circuit, either on a printed circuit board or simply wired as a component on a chassis. In some applications, however, the number of transistors used is great and the wiring is not easily reached for removing soldered connections. In such cases it would be most desirable if the transistors could be removably positioned in a socket in a manner similar to a vacuum tube. Then the circuit could be designed such that all transistors are accessible from one side of a chassis or circuit board and they could be easily changed without the need for interfering with soldered connections. Considerable difficulty has been experienced in designing acceptable transistor sockets, however, because of a number of considerations among which is the fact that, unlike vacuum tube pins, the connecting wires are easily bent and misaligned. Many socket designs are too large to permit installation in a number of locations, and a very considerable problem has been experienced in finding designs which would meet the very rigorous specifications of the armed services as to withstanding vibration and shock forces. It is therefore an object of the present invention to provide a socket for transistors and the like which is of minimum practicable size.

It is another object of the present invention to provide a socket meeting the above objective and which includes retaining means for holding a transistor securely in position such that it will withstand considerable shock and vibration and yet permit easy removal and replacement of the transistor.

It is a further object of the above invention to provide a socket meeting the above objectives and which is designed such that the possibility of accidental shorting of the terminals to the case of the transistor even during vibration is minimized.

Other objects and advantages will become apparent from perusal of the following specification taken in connection with the accompanying drawings in which.

Figure 1:
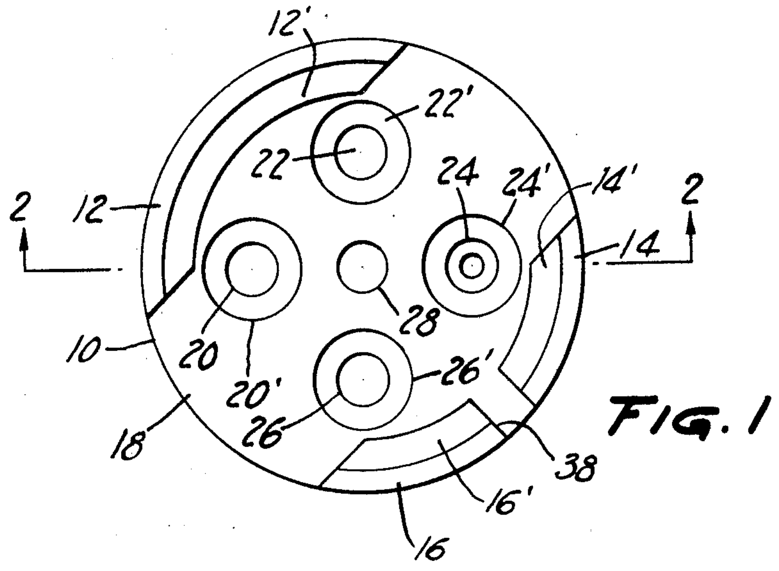
FIG. 1 is a plan view of my transistor socket as viewed from the top.
Figure 2:
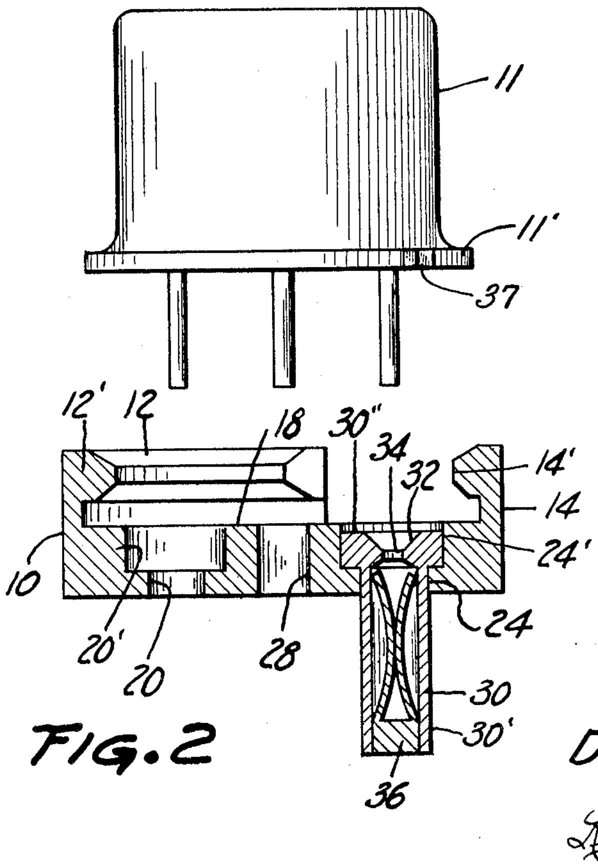
FIG. 2 is a sectional view taken on line 2—2 of FIG. 1.

Referring now to FIGS. 1 and 2, a base section 10 is shown having a diameter slightly larger than the diameter of the transistor to be plugged into it. This socket is not for all transistors but is useful for use with a large series having a generally cylindrical configuration 11 with a flared skirt 11' at the base. Base 10 is typically formed of a relatively tough, resilient, insulating plastic material such as tetrafluoroethylene resin, marketed under the trade name "Teflon." This material has the additionally desirable quality of being very slippery (self-lubricating) so that a transistor may be enabled to slide over its surface easily. Member 10 includes a plurality of retaining wall sections 12, 14, 16 arranged around its periphery including inwardly projecting lip portions 12', 14', 16' which act to retain the skirt 11' thus holding the transistor 11 against the contacting surface 18 of base 10. It will be observed that each of these retaining wall sections includes a thin wall section adjacent the contacting surface 18 below the lip portions. These sections permit the lip portions 14', 16', 18' to spring backward to permit passage of the skirt 11'. The base 10 is provided with a plurality of axial passageways 20, 22, 24, 26 which are counterbored through part of the thickness of the base as shown at numerals 20', 22', 24' and 26'. A center passage 28 is included for receiving an eyelet or other means for attaching the base 10 to a printed circuit board, if desired.

Inserted in the passageways 20, 22, 24, and 26 are a plurality of contacting pins, only one of which 30 is shown in FIG. 2. This pin has a long, small diameter section 30' in passageway 24 and a larger diameter section 30'' which rests in the counter bore 24'. Contacting pin 30 also has a tapered entrance section 32 and a restricted guide 34. A spring contact member 36 is placed within the small diameter section 30' and includes an end section which closes the end of pin 30 so that, should pin 30 be subjected to dip soldering, the solder will not flow up inside of it and solder the transistor to the pin. Guide 34 causes the connecting wires of transistor 11 to be directed between the leaves of contact member 36. It will be observed that the large diameter section 30'' of pin 30 is not as thick as the depth of counterbore 24' thereby avoiding any possible connection between the metal case of transistor 11 and one of its connecting wires.

Figure 3:
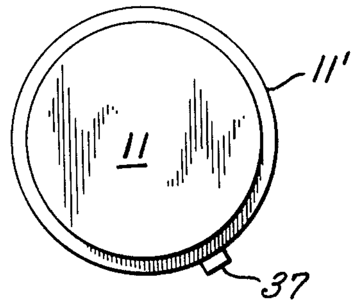
FIG. 3 is a plan view showing the transistor locating tab.

A transistor such as that shown at numeral 11 typically includes a locating tab 37 on the edge of its skirt (see FIG. 3) and an insert keyway 38 located between retaining wall sections 14 and 16 receives this tab, thus insuring proper radial alignment of the transistor wires with their respective contacting pins.

It will be apparent from the foregoing that the transistor 11, once installed, is held very firmly against base 10 by means of the lip portions of the retaining wall sections 14, 16, 18 and also by the spring contact members 36 which grasp the connecting wires of the transistor firmly within the pins 30. Nevertheless, a technician can remove the transistor by firmly pulling it straight out of the pins, perhaps wiggling it slightly to aid in deflecting the resilient wall members 14, 16, 18 sufficiently to allow passage of the skirt 11'.

While only one embodiment has been shown and described herein, modifications will occur to those skilled in the art. The height of the retaining walls can be varied as transistor designs require. The thickness of the base may vary if the contacting pins are anchored differently. Other modifications may be made without departing from the spirit and scope of the invention.

I claim:

A socket for releasably engaging a transistor, said transistor being of the type having an external form composed of a cylindrical envelope closed at one end and terminating at the other end in a flat circular base of greater diameter than said envelope thereby defining an outwardly flaring base skirt portion, said socket comprising a flat disk having a plurality of channels extending perpendicularly therethrough for receiving wires from the base of said transistor, a first peripheral wall portion extending upwardly from the circumference of said disk so as to clear said transistor skirt and surround an arcuate portion of the edge of said skirt, a first bevelled flange portion formed inwardly from the upper edge of said wall so as to embrace a first portion of said transistor skirt between the lower edge of said flange and said disk, and at least one additional peripherally discontinuous wall and flange portion similar to said first wall and flange portion positioned along the edge of said disk diametrically opposite a segment of said first wall portion so as to embrace a second portion of said transistor skirt diametrically opposite said first portion thereof, the whole of said socket being molded as a single unitary piece of resilient insulating material.

References Cited by the Examiner

UNITED STATES PATENTS

| | | | |
|---|---|---|---|
| 2,099,405 | 11/1937 | Langdon. | |
| 2,105,833 | 1/1938 | Feuer et al. | |
| 2,462,036 | 2/1949 | Clark. | |
| 2,724,095 | 11/1955 | Rudner | 339—193 |
| 2,741,747 | 4/1956 | Woofter. | |
| 2,843,832 | 7/1958 | Bretthauer | 339—91 |
| 2,882,514 | 4/1959 | Krantz. | |
| 2,952,830 | 9/1960 | Sperzel et al. | 339—94 |
| 3,003,135 | 10/1961 | Purinton | 339—258 |
| 3,018,462 | 1/1962 | Barre, et al. | 339—193 |
| 3,067,974 | 12/1962 | Baldwin. | |

FOREIGN PATENTS

| | | |
|---|---|---|
| 137,311 | 5/1950 | Australia. |
| 336,612 | 10/1930 | Great Britain. |
| 614,012 | 12/1948 | Great Britain. |

JOSEPH D. SEERS, *Primary Examiner.*